(12) United States Patent
Choi

(10) Patent No.: US 6,662,290 B2
(45) Date of Patent: Dec. 9, 2003

(54) ADDRESS COUNTER AND ADDRESS COUNTING METHOD

(75) Inventor: Jin-Hyeok Choi, Ichon-shi (KR)

(73) Assignee: Hynix Semiconductor Inc., Ichon-shi (KR)

(*) Notice: Subject to any disclaimer, the term of this patent is extended or adjusted under 35 U.S.C. 154(b) by 62 days.

(21) Appl. No.: 10/026,464

(22) Filed: Dec. 27, 2001

(65) Prior Publication Data

US 2002/0087826 A1 Jul. 4, 2002

(30) Foreign Application Priority Data

Dec. 29, 2000 (KR) .......................................... 2000-85509

(51) Int. Cl.$^7$ .............................................. G06F 12/08
(52) U.S. Cl. .......................... 711/217; 711/3; 711/200; 365/230.01
(58) Field of Search ........................... 711/3, 200, 217; 365/230.01

(56) References Cited

U.S. PATENT DOCUMENTS 6,038,648 A * 3/2000 Nakaoka ...................... 711/200

* cited by examiner

*Primary Examiner*—Reginald G. Bragdon
*Assistant Examiner*—Midys Inoa
(74) *Attorney, Agent, or Firm*—Jacobson Holman PLLC

(57) ABSTRACT

An address counter and address counting method is provided for enhancing an operational speed by forming a path for outputting a corresponding output address as soon as an external address or a previous internal address is inputted and further generating both a path for the case when a parity signal having a high state is inputted and a path for the case when a parity signal having a low state is inputted. While the paths are being produced, the parity signal is generated and the next internal address is immediately outputted in response to the generation of the parity signal. Moreover, an operation of latching the next address is terminated as soon as the parity signal is generated.

4 Claims, 9 Drawing Sheets

ADDRESS COUNTER AND ADDRESS COUNTING METHOD

FIELD OF THE INVENTION

The present invention relates to a semiconductor memory device; and, more particularly, to an address counter and address counting method capable of enhancing an operational speed by forming a path for outputting a corresponding output address as soon as an external or a previous internal address is inputted and generating both a path for the case when a parity signal having a high state is inputted and a path for the case when a parity signal having a low state is inputted. At the same time as producing the parity signal, the next internal address is immediately outputted in response to the generation of the parity signal.

BACKGROUND OF THE INVENTION

In general, existing DRAM, SRAM and flash memory devices employ a burst mode access function. Therefore, they need a circuit for counting addresses for the next data access operation inside the memory devices. As an operational speed of the memory devices goes faster, it is necessary to enhance an operational speed of the address counting circuit.

Conventional address counting schemes can be classified into two methods. Referring to FIGS. 1 and 2, there are shown schematic flow charts of the conventional address counting methods.

In FIG. 1, a flow chart of one example of the conventional address counting method is described, which receives an external address in step S11, latches the external address in step S12, generates a first parity corresponding to a first address in step S13 before outputting the first address in step S14, and produces a second parity corresponding to a second address in step S15 before outputting the second address in step S16.

In FIG. 2, a flow chart of the other example of the conventional address counting method is illustrated, which receives an external address in step S21, latches the external address in step S22 at the same time of generating a first parity corresponding to a first address in step S23, outputs the first address in step S24, produces a second parity corresponding to a second address in step S25 and, then, outputs the second address in step S26.

Referring to FIG. 3, a circuit diagram of a conventional address counter implemented as a unit block is depicted.

A first NAND gate 31 receives and logically combines an external column address signal, eyoz, and an inverted control signal outputted from a first inverter I31 that inverts a control signal, seqx_intz, determining a counting scheme. An output signal of the first NAND gate 31 is transferred to a first latch circuit 33 through a first transmission gate T31, which operates in response to an address latch command signal, setz, and an inverted address latch command signal, setx.

The first latch circuit 33 includes a second inverter I32 and a third inverter I33 that operates in response to a next address generating signal, incx, and an inverted next address generating signal, incz, when a corresponding parity signal is inputted, and latches the output signal of the first NAND gate 31.

An output signal of the first latch circuit 33 is inverted by a fourth inverter I34, which operates in response to the next address generating signal, incx, and the inverted next address generating signal, incz, when the parity signal is coupled, and then inputted to a second latch circuit 34.

The second latch circuit 34 consists of a fifth inverter I35 and a sixth inverter I36 that operates in response to the next address generating signal, incx, and the inverted next address generating signal, incz, when the parity signal is provided, and latches an output signal of the fourth inverter I34. Further, the second latch circuit 34 outputs the latched signal as a first output signal onz.

Moreover, the output signal of the first NAND gate 31 transferred through the first transmission gate T31 is delivered to an output node of the second latch circuit 34 through a second transmission gate T32 that operates in response to the next address generating signal, incx, and the inverted next address generating signal, incz, when the parity signal is inputted, without passing through the first and the second latch circuits 33 and 34.

Meanwhile, a second NAND gate 32 receives and logically combines the control signal, seqx_intz, and the external column address signal, eyoz. An output signal of the second NAND gate 32 is provided to a third latch circuit 35 through a third transmission gate T33 that operates responsive to the address latch command signal, setz, and the inverted address latch command signal, setx.

The third latch circuit 35 is composed of an eighth inverter I38 and a ninth inverter I39 and latches the output signal of the second NAND gate 32 transferred through the third transmission gate T33. A tenth inverter I40 inverts an output signal of the third latch circuit 35 and outputs the inverted signal as a first selection signal sel1. Moreover, the output signal of the third latch circuit 35 is produced as a second selection signal, sel2.

The output signal of the second latch circuit 34 is buffered by a seventh inverter I37 and an eleventh inverter I41 and, then, transferred through a fourth transmission gate T34. Further, the output signal of the second latch circuit 34 is inverted by the seventh inverter I37 and, then, delivered through a fifth transmission gate T35.

The fourth and the fifth transmission gates T34 and T35 inversely operate in response to the first and the second selection signals, sel1 and sel2. As a result, a signal transmitted through the fourth or the fifth transmission gate T34 or T35 is inverted by a twelfth inverter I42 and, then, outputted as a second output signal, yacntz.

The address counting method depicted in FIG. 1 shows a maximum operational speed of about 200 MHz while the other method explained in FIG. 2 accomplishes a maximum operational speed of about 250 MHz. Therefore, there is no problem in the operational speed so far. However, for the next generation DRAM or SRAM devices, there will be required a faster operational speed of about several hundred MHz, so that there is a need to employ an address counter operating faster than the conventional address counters.

SUMMARY OF THE INVENTION

It is, therefore, a primary object of the present invention to provide an address counter and address counting method capable of enhancing an operational speed.

Another object of the present invention is to provide an address counter and address counting method having an operational speed applicable to the next generation memory devices.

The present invention forms a path for outputting a corresponding output address as soon as an external or a previous internal address is inputted and generates both of a path for the case a parity signal having a high state is inputted and that for the case the parity signal having a low state is provided. At the same time of producing the two paths, the parity signal is generated and the next internal address is immediately outputted in response to the generation of the parity signal. Further, an operation of latching the next address is also terminated as soon as the parity signal generated. That is, if a first address is generated, the next parity signal is produced and stands by ready, without control of an additional control signal, to allow a second address to be instantly outputted when it is required. Therefore, a whole operational speed of the address counter only depends on time required to output the parity signal and this time is about 1 ns, so that it is possible to achieve a maximum counting operation of about 1 GHz.

In accordance with an aspect of the present invention, there is provided an address counter comprising a plurality of address counting blocks, wherein each address counting block includes:

a first inverting unit for receiving and inverting an external address in response to a first control signal and an inverted first control signal;

a second inverting unit for receiving and inverting a previous internal address in response to a second control signal and an inverted second control signal;

a third inverting unit for inverting an inverted external address or an inverted previous internal address which is provided from the first or the second inverting unit to thereby output an output address;

a latching unit for latching the inverted external address or the inverted previous internal address;

a logic unit for generating a parity signal by logically combining an output signal from the latching unit and output signals from latching units of previous address counting blocks;

a first transmission gate for providing the second inverting unit with a delayed output signal of the latching unit as the previous internal address in response to a previous parity signal and an inverted previous parity signal supplied from a preceding address counting block; and a second transmission gate for supplying the second inverting unit with an inverted delayed output signal of the latching unit as the previous internal address in response to the previous parity signal and the inverted previous parity signal, wherein the first and the second transmission gates inversely operate responsive to the previous parity signal and the inverted previous parity signal.

In accordance with another aspect of the present invention, there is provided an address counting method comprising the steps of:

(a) receiving an external address or a previous internal address and forming a first internal address path for the case when a first parity signal having a high state is inputted and a second internal address path for the case when the first parity signal having a low state is inputted at the same time of generating the first parity signal;

(b) producing a current internal address by using the first or the second internal address path according to the state of the first parity signal at the same time of outputting a second parity signal;

(c) if the next internal address is required, forming a third internal address path for the case when the second parity signal having a high state is inputted, and a fourth internal address path for the case when the second parity signal having a low state is inputted by using the current internal address; and (d) generating the next internal address by using the third or the fourth internal address path according to the state of the second parity signal.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF THE PREFERRED EMBODIMENTS

Hereinafter, some preferred embodiments of the present invention will be described in detail with reference to the accompanying drawings.

Figure 1:
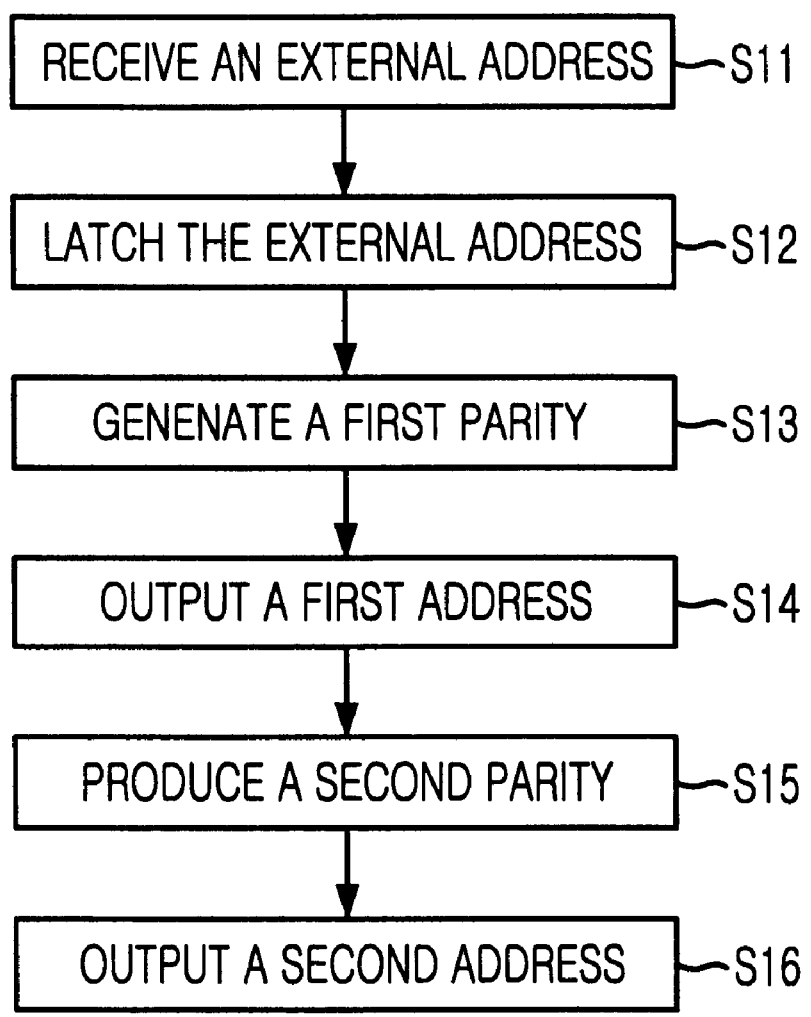
FIG. 1 is a schematic flow chart showing one example of a conventional address counting method.
Figure 2:
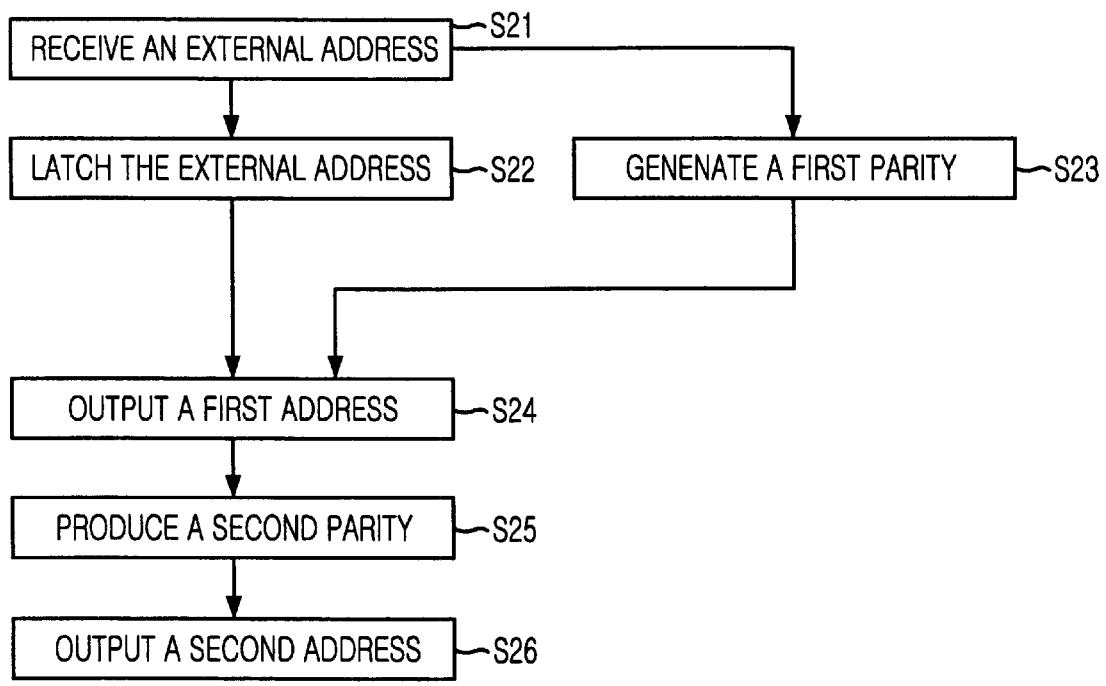
FIG. 2 is a schematic flow chart representing another example of the conventional address counting method.
Figure 3:
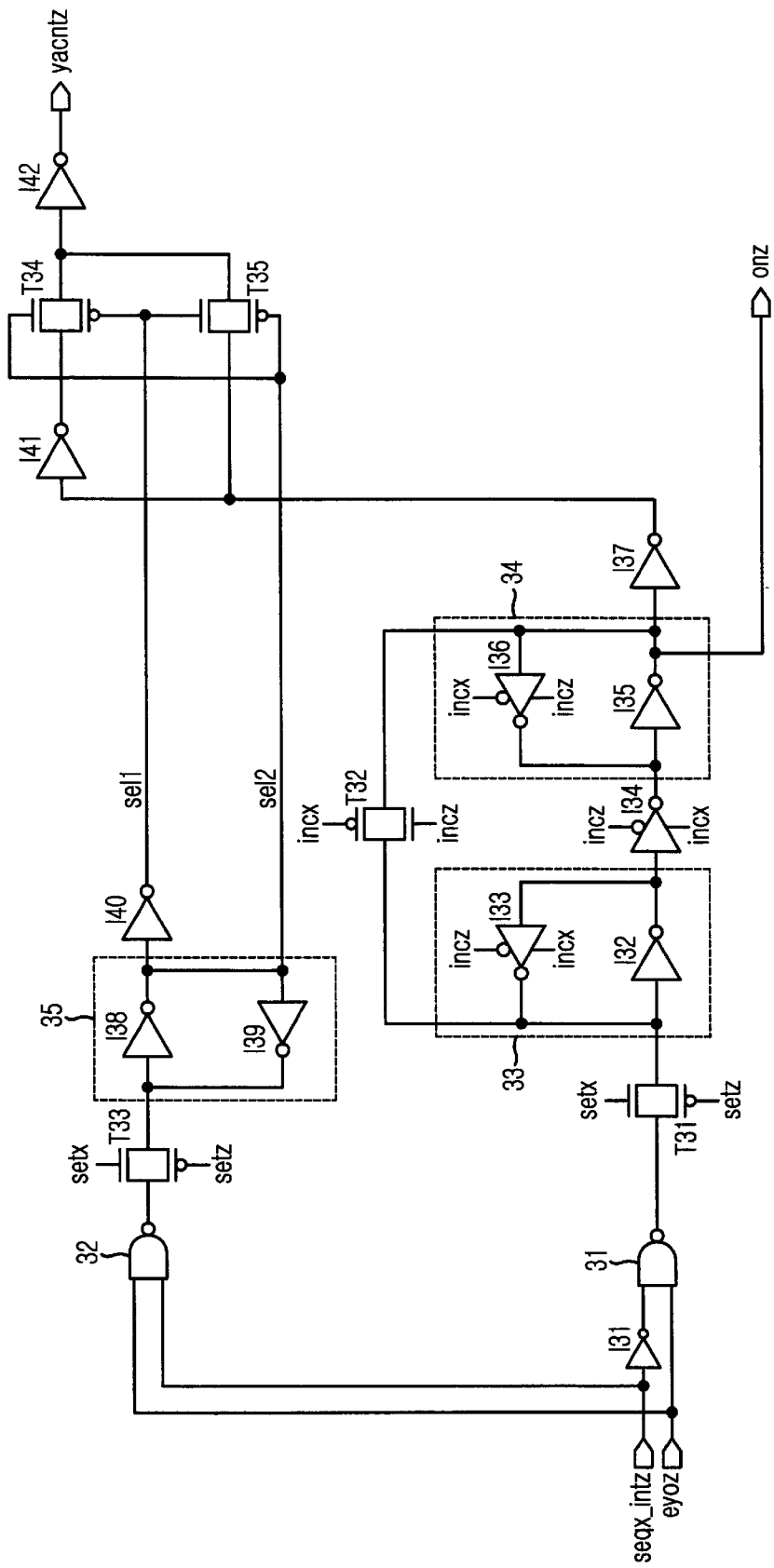
FIG. 3 provides a circuit diagram of a conventional address counter implemented as a unit block.
Figure 4:
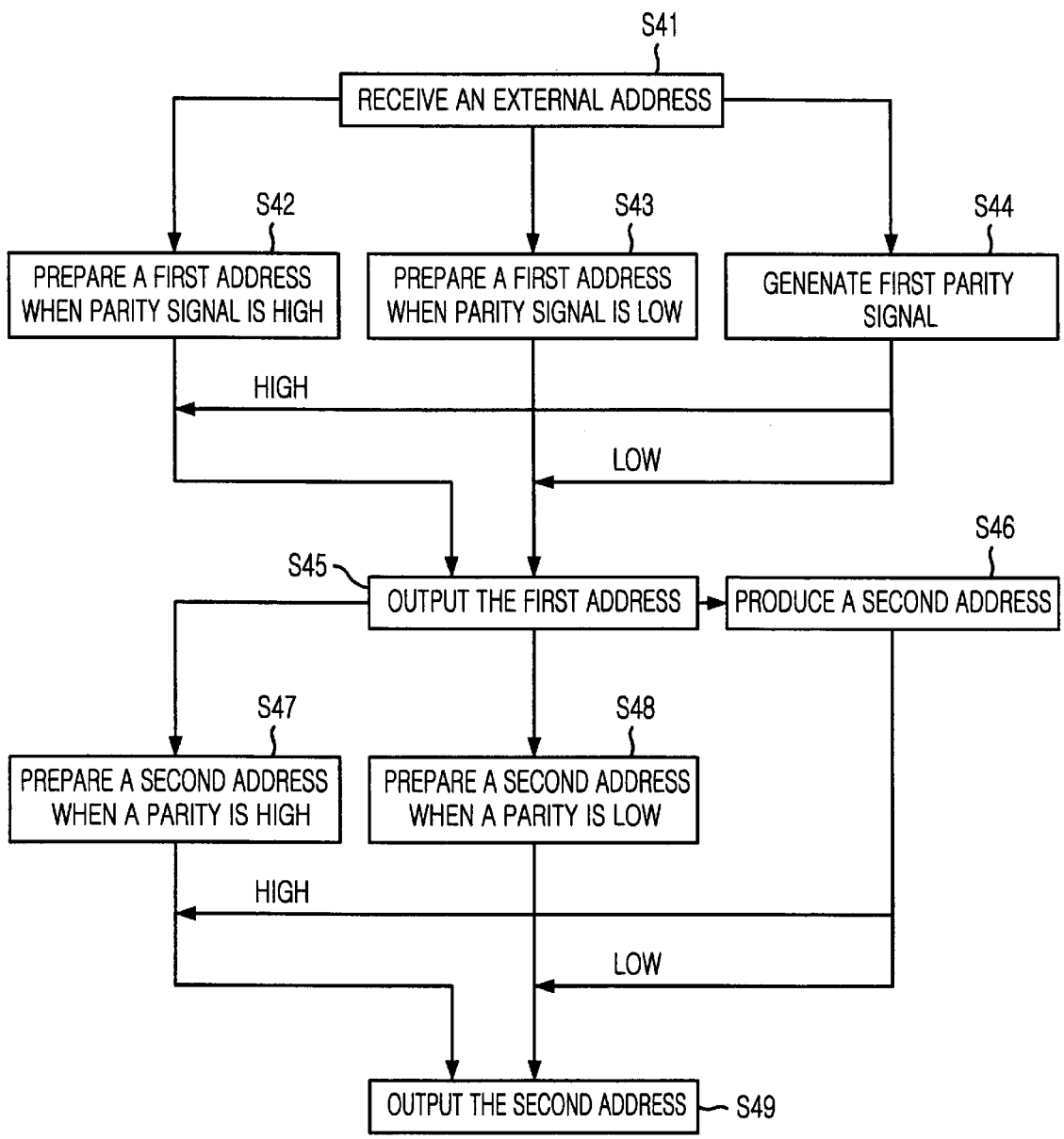
FIG. 4 is a flow chart describing an address counting method in accordance with the present invention.

Referring to FIG. 4, a flow chart describing an address counting method in accordance with the present invention is shown.

If an external address or a previous internal address is inputted in step S41, a first address path is formed for the case when a first parity signal having a high state is inputted and for the case when the first parity signal having a low state is inputted in steps S42 and S43, respectively. Concurrently with the performing of steps S42 and S43, the first parity signal is produced in step S44.

According to a state of the first parity signal, in step S45, a first address is produced through the use of the previously formed first address path. Then, a second parity signal is generated in step S46.

If the next address is required, a second address path is formed for the case when the second parity signal having a high state is inputted and for the case when the second parity signal having a low state is inputted in steps S47 and S48, respectively, by using the first address. Then, a second address is outputted through the use of the second address path according to a state of the second parity signal in step S49.

Figure 5:
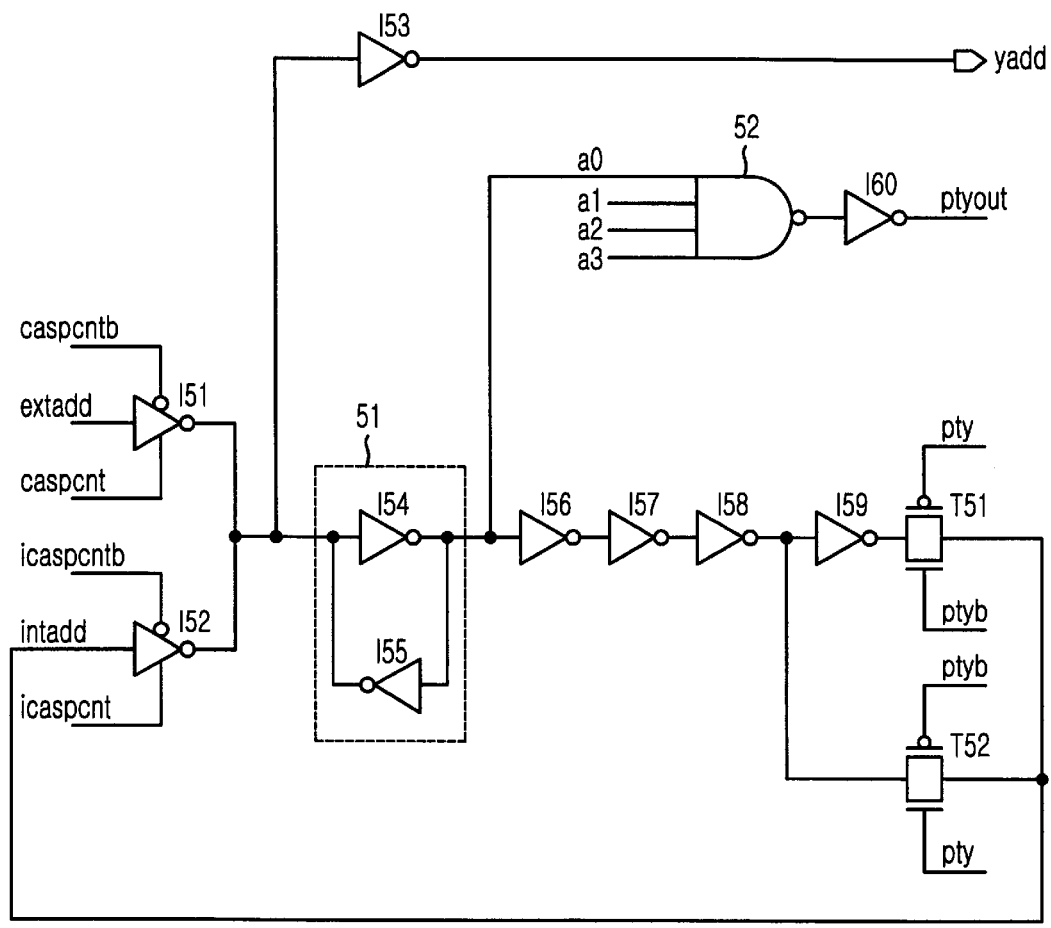
FIG. 5 illustrates a circuit diagram of an address counter implemented as a unit block in accordance with the present invention.

Referring to FIG. 5, a circuit diagram of an address counter implemented as a unit address counting block is illustrated in accordance with the present invention.

In FIG. 5, there are shown an external address input node for generating a first internal address and an internal address input node for producing the next internal addresses starting from a second internal address.

A first inverter I51 inverts an external address, extadd, in response to a signal, caspcnt, for use in generating the first internal address from the external address, extadd, and an inverted signal, caspcntb, of the signal, caspcnt.

A second inverter I52 inverts a previous internal address, intadd, in response to a signal, icaspcnt, for producing the next internal address from the previous internal address, intadd, and an inverted signal icaspcntb of the signal, icaspcnt.

A third inverter I53 inverts one of the output signals from the first and the second inverters I51 and I52, to output the inverted signal as a column address signal, yadd.

Meanwhile, a latch circuit 51 consisting of a fourth inverter I54 and a fifth inverter I55 latches one of the output signals from the first and the second inverters I51 and I52 and provides a NAND gate 52 with the latched signal as an input signal a0.

The NAND gate 52 logically combines several input signals, e.g., a0, a1, a2 and a3, to thereby output a logically combined signal. The logically combined signal is provided to a tenth inverter I60, which, in turn, inverts the logically combined signal so as to output a parity signal, ptyout.

The latched signal outputted from the latch circuit 51 is inverted and delayed by passing through sixth to eighth inverters I56 to I58. The inverted and delayed signal is inputted to the second inverter I52 as the previous internal address, intadd, via a second transmission gate T52 operating in response to a parity signal, pty, and a parity bar signal, ptyb.

Further, the latched signal outputted from the latch circuit 51 is delayed by passing through the sixth to ninth inverters I56 to I59 and the delayed signal is inputted to the second inverter I52 as the previous internal address, intadd, via a first transmission gate T51 operating in response to the parity signal, pty, and the parity bar signal, ptyb.

In the above, the first and the second transmission gates T51 and T52 inversely operate according to states of the parity signal, pty, and the parity bar signal, ptyb. Therefore, if the parity signal, pty, has a low state, the signal delivered through the first transmission gate T51 is inputted to the second inverter I52 as the previous internal address, intadd. On the other hand, if the parity signal, pty, has a high state, the signal transmitted through the second transmission gate T52 is coupled to the second inverter I52 as the previous internal address, intadd. Although not shown in the drawings, the parity bar signal, ptyb, is generated by logically combining an enable signal, en, and a parity input signal delivered from a previous address counting block by using a NAND gate and the parity signal, pty, is produced by inverting the parity bar signal, ptyb.

Figure 6A:
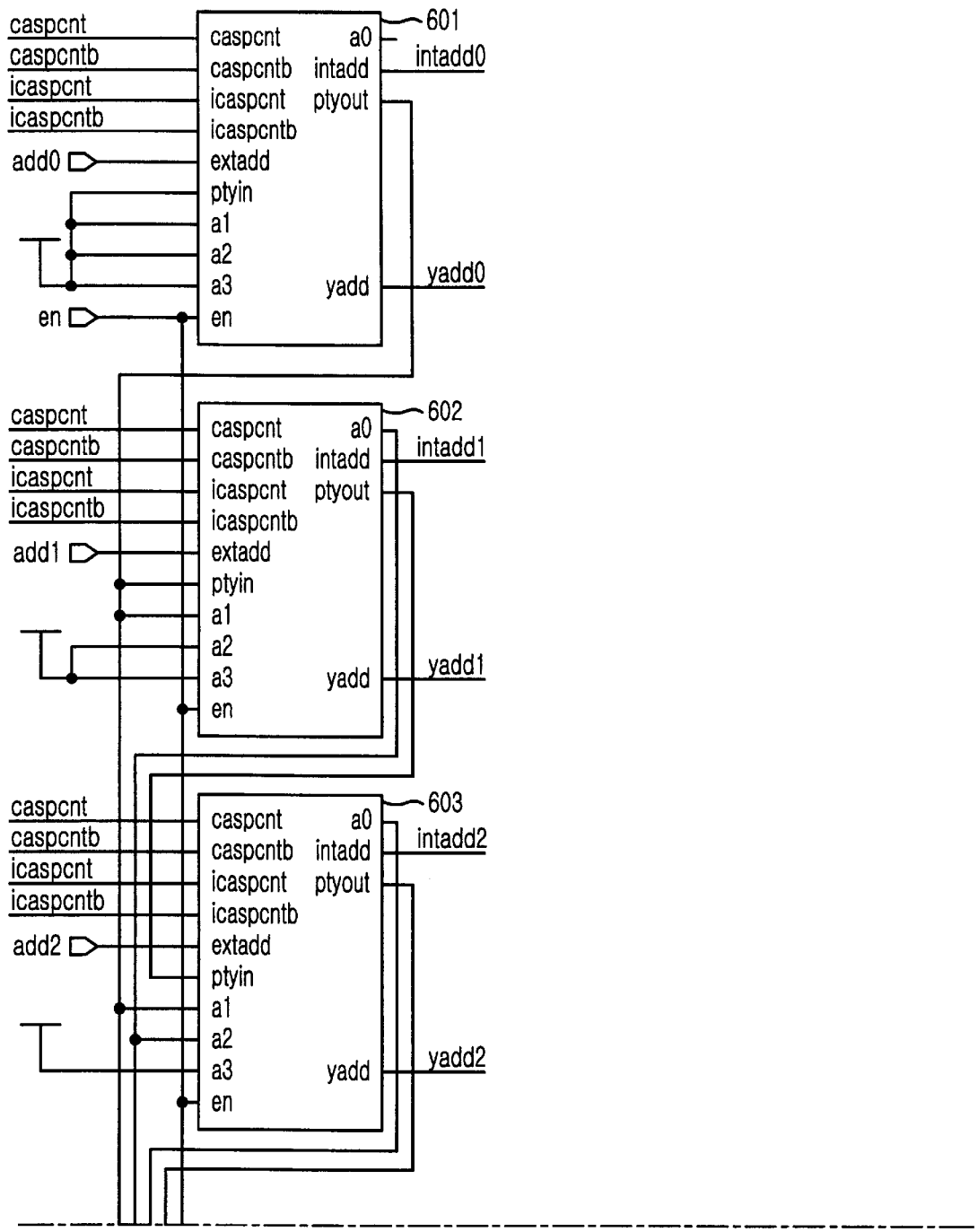
FIGS. 6A and 6B present a constitutional diagram of an address counter implemented for 11 addresses by connecting 11 numbers of unit blocks in accordance with an embodiment of the present invention.
Figure 6B:
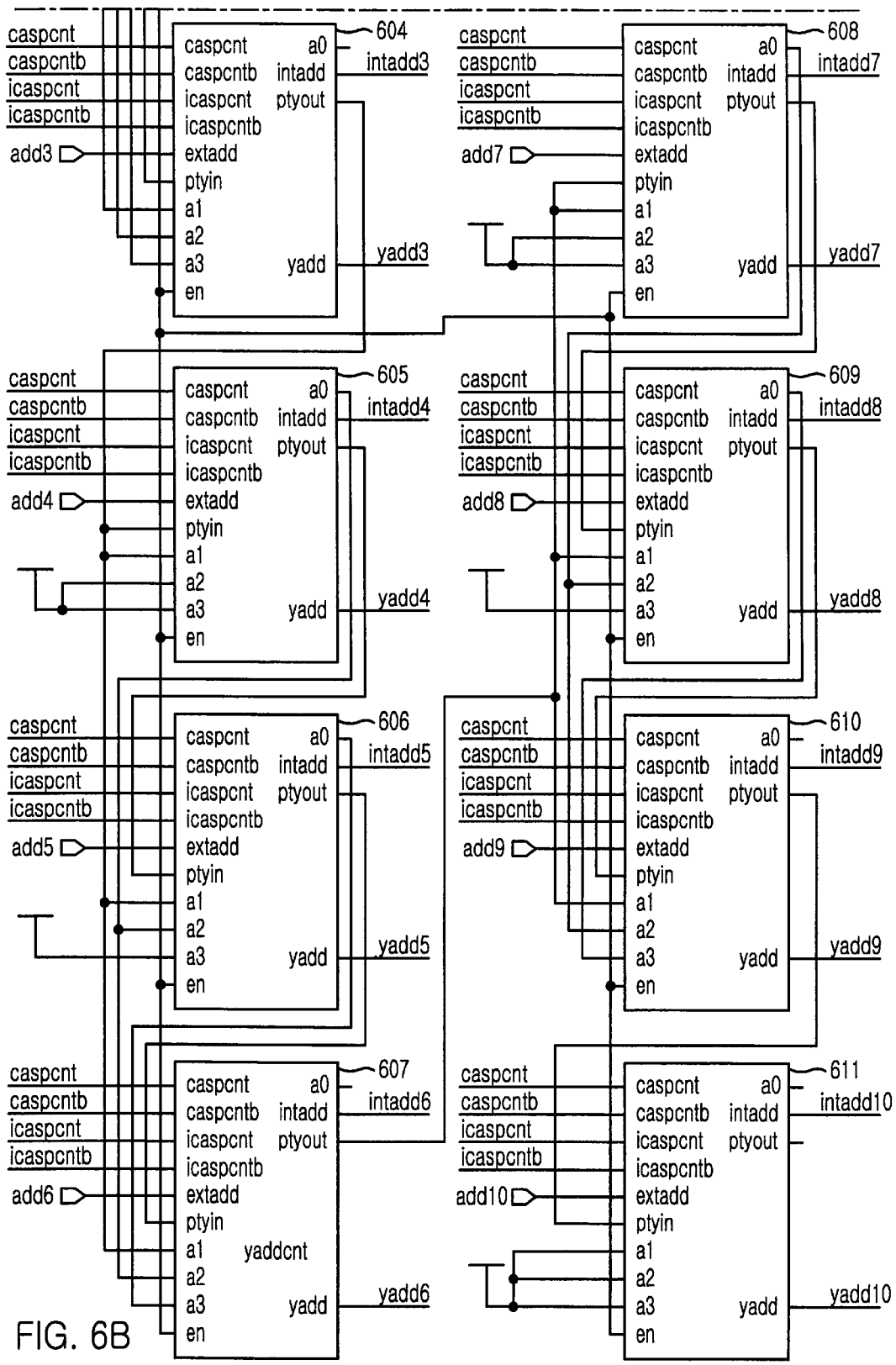

Referring to FIGS. 6A and 6B, there is presented a constitutional diagram of an address counter implemented for 11 numbers of address pins by connecting 11 numbers of address counting blocks 601 to 611 in accordance with an embodiment of the present invention.

Hereinafter, the operation of the inventive address counter will be explained with reference to FIGS. 5 to 7.

At first, for the first address counting block 601, if the signal, caspcnt, is inputted to generate a first internal address, intadd0, from an external address, add0, the external address, add0, is simultaneously transferred to a path for producing a parity signal, ptyout, a first output path for the case when a parity signal, pty, has a high state and a second output path for the case when the parity signal, pty, has a low state, wherein the internal address, intadd0, is outputted through the first or the second output path according to the state of the parity signal as shown in FIG. 5. The first internal address, intadd0, is coupled to the second inverter I52 as a previous internal address so as to be used to output the next column address and the next internal address in response to the signals, icaspcnt and icaspcntb. As described in FIGS. 6A and 6B, the parity signal, ptyout, outputted from the first address counting block 601 is provided to input nodes of transmission gates in the following address counting block 602 and, further, supplied to input nodes of NAND gates in the following three address counting blocks 602 to 604 to be used to determine parity signals ptyout of the address counting blocks 602 to 604 since a four input NAND gate is employed to produce the parity signal, ptyout, and, thus, the four address counting blocks, e.g., 601 to 604, construct one operational group. The address counting blocks 602 to 604 also operate in the same manner as in the first address counting block 601. That is, the parity signal, ptyout, of the second address counting block 602 is provided to the address counting blocks 603 and 604, and that of the third address counting block 603 is supplied to the fourth address counting block 604 as illustrated in FIG. 6A.

Further, according to this configuration, the fourth address counting block 604 plays a role as a first address counting block for the next operational group consisting of address counting blocks 604 to 607 and, as a result, the parity signal, ptyout, outputted from the fourth address counting block 604 is provided to the following address counting blocks 605 to 607. Likewise, the above operational connection is applied to the rest of the address counting blocks 608 to 611 as described in FIG. 6B.

Referring back to FIG. 5, the seventh and the eighth inverters I57 and I58 are used to delay an internal address by as much as about 1 ns to thereby keep timing with the parity signal, pty, provided from its previous address counting block to the input nodes of the transmission gates T51 and T52. As a result, the internal address can be outputted as soon as the parity signal, pty, is coupled to the transmission gates T51 and T52 from the previous address counting block and, thus, the whole time required for the address counting operation only depends on the transmission time of the parity signal, pty.

That is, if the external address, extadd, is inputted to the address counter, the signal, caspcnt, is produced to deliver the external address, extadd, to inside of the address counter and, as a result, the external address is outputted as the column address, yadd, and, at the same time, latched in the latch circuit 51. The latched address is transferred to the internal address node, intadd, via the inverters I56 to I59 and the transmission gate T51 or T52. Then, if the signal, icaspcnt, is enabled, the transferred internal address is outputted the next column address and also latched in the latch circuit 51 for generating the next internal address. Therefore, no further control signal is needed to produce the next internal address. However, at this time, if a pulse width of the signal, icaspcnt, is too long and, thus, continuously inputted during the internal address being latched after one internal address is outputted, the following internal addresses may be generated without break. Therefore, the pulse width of the signal, caspcnt, or the signal, icaspcnt, should be shorter than a whole loop time.

Figure 7:
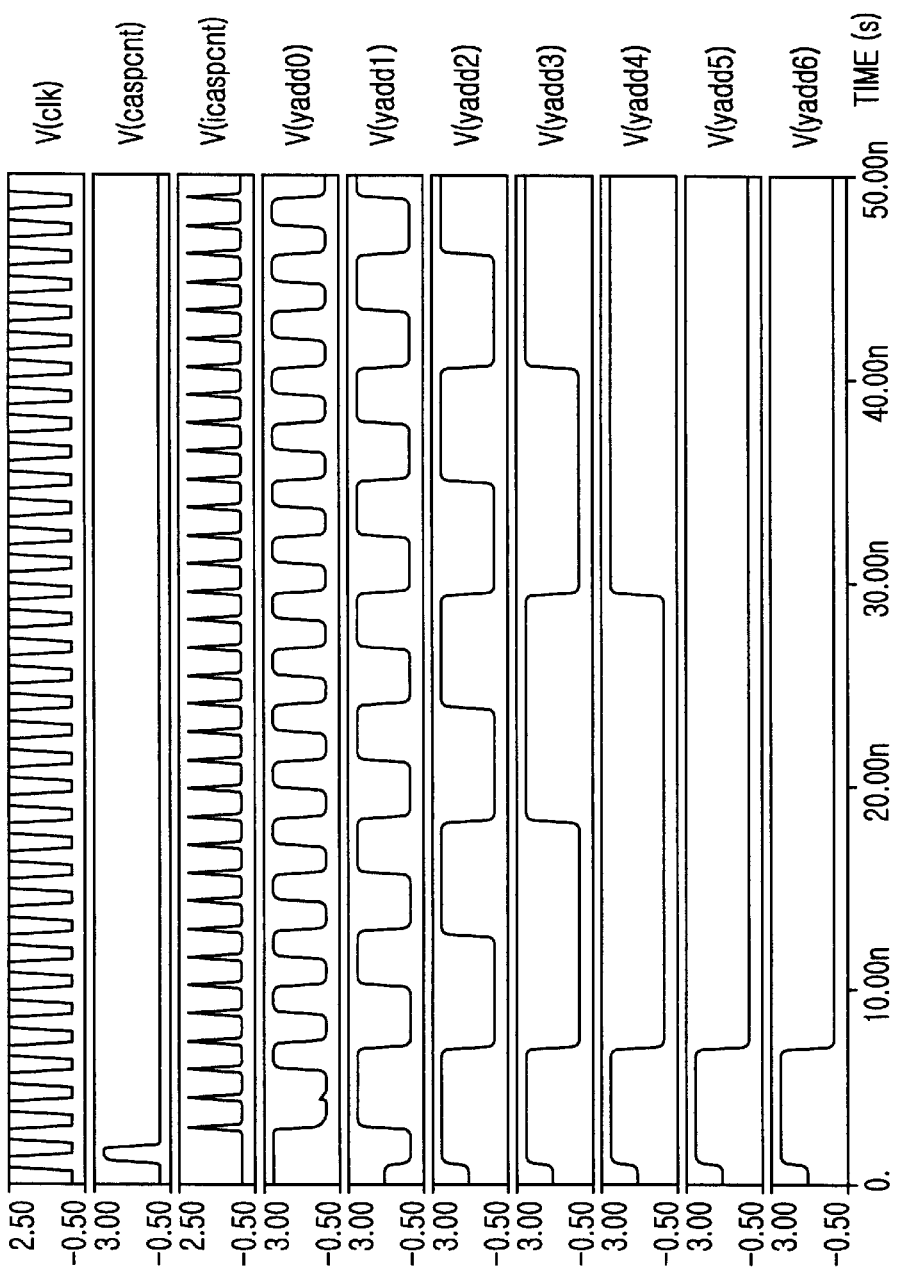
FIG. 7 shows a simulation result of the address counter in FIGS. 6A and 6B.

Referring to FIG. 7, there is shown a simulation result of the address counter described in FIGS. 6A and 6B for a clock frequency of 700 MHz. As apparent from the simulation result, the address counter normally operates at a frequency of 700 MHz. If a more optimized condition is found, the address counter can operate at a frequency of 1 GHz.

In accordance with the present invention, there is provided the address counter. Although there is shown only an address counter in memory devices as a circuit requiring a high-speed operation, the inventive high-speed circuit can be differently used in other devices such as ASIC.

As described above, since the inventive address counter can accomplish a higher speed operation compared to the conventional address counter operating at a frequency ranging from 200 to 300 MHz, the present invention can implement a high-speed operation in DRAM, SRAM or flash memories. Further, since the address counting block of the inventive address counter is simpler than that of the conventional address counter and, thus, the whole configuration of the inventive address counter is also simpler than that of the conventional address counter, it is possible to reduce a whole layout area of the address counter. The use of the inventive address counter is not limited to memory devices. For instance, the inventive counter can be applicable to ASICs requiring a faster operation than memory devices.

While the present invention has been described with respect to the particular embodiments, it will be apparent to those skilled in the art that various changes and modifications may be made without departing from the spirit and scope of the invention as defined in the following claims.

What is claimed is:

1. An address counter comprising a plurality of address counting blocks, wherein each address counting block includes:

a first inverting means for receiving and inverting an external address in response to a first control signal and an inverted first control signal;

a second inverting means for receiving and inverting a previous internal address in response to a second control signal and an inverted second control signal;

a third inverting means for inverting an inverted external address or an inverted previous internal address that is provided from the first or the second inverting means to thereby output an output address;

a latching means for latching the inverted external address or the inverted previous internal address;

a logic means for generating a parity signal by logically combining an output signal from the latching means and output signals from the latching means of previous address counting blocks;

a first transmission gate for providing the second inverting means with a delayed output signal of the latching means as the previous internal address in response to a previous parity signal and an inverted previous parity signal supplied from a preceding address counting block; and a second transmission gate for supplying the second inverting means with an inverted delayed output signal of the latching means as the previous internal address in response to the previous parity signal and the inverted previous parity signal, wherein the first and the second transmission gates inversely operate responsive to the previous parity signal and the inverted previous parity signal.

2. The address counter as recited in claim 1, wherein the logic means employs a NAND gate and an inverter connected in series.

3. The address counter as recited in claim 1, wherein the delay time of the outpu signal of the latching means is determined depending on a time required in the previous parity signal being transmitted from the preceding address counting block to the first and the second transmission gates.

4. An address counting method comprising the steps of:

(a) receiving an external address or a previous internal address generating a first parity signal, forming a first internal address path for the case when a first parity signal having a high state is inputted; and forming a second internal address path for the case when the first parity signal having a low state is inputted;

(b) producing a current internal address by using the first or the second internal address path according to the state of the first parity signal at the same time of outputting a second parity signal;

(c) if the next internal address is required, forming a third internal address path for the case when the second parity signal having a high state is inputted and a fourth internal address path for the case when the second parity signal having a low state is inputted by using the current internal address; and (d) generating the next internal address by using the third or the fourth internal address path according to the state of the second parity signal.

* * * * *